United States Patent [19]

Boyle

[11] Patent Number: 4,720,670
[45] Date of Patent: Jan. 19, 1988

[54] ON CHIP PERFORMANCE PREDICTOR CIRCUIT

[75] Inventor: David H. Boyle, Manassas, Va.

[73] Assignee: International Business Machines Corporation, Armond, N.Y.

[21] Appl. No.: 945,728

[22] Filed: Dec. 23, 1986

[51] Int. Cl.$^4$ ............................................. G01R 31/02
[52] U.S. Cl. ................................ 324/73 R; 324/158 R
[58] Field of Search ................... 387/479, 296 R, 510, 387/491, 501; 328/151; 324/73 R, 158 R, 158 T; 29/574

[56] References Cited

U.S. PATENT DOCUMENTS 4,631,421 12/1986 Inoue et al. ..................... 307/296 R

FOREIGN PATENT DOCUMENTS

| 5319814 | 9/1979 | Japan | ............... 307/296 R |
| 0025220 | 2/1980 | Japan | ............... 307/296 R |
| 0058658 | 4/1985 | Japan | ................ 324/73 R |
| 0170768 | 9/1985 | Japan | ............... 324/158 T |

*Primary Examiner*—Reinhard J. Eisenzopf
*Assistant Examiner*—W. Burns
*Attorney, Agent, or Firm*—John E. Hoel

[57] ABSTRACT

An on chip monitoring circuit is disclosed which enables the rapid characterization of signal propagation speed for integrated circuits on the same chip. The circuit is based upon a correlation between signal propagation speed on the chip and the low pass filtering characteristics of the monitoring circuit, which is a classical first order low pass filter. The monitoring circuit performs the low pass filter operation from which the operator can determine what the signal propagation characteristics are for other integrated circuits on the chip resulting from specific process parameters which occurred during the fabrication of the chip. A feature of the invention is its ability to characterize very small capacitive and resistive contributions to signal propagation delay by using input driving frequencies which are moderately low, by using the principle of the Miller Theorem. The monitoring circuit enables the rapid and accurate characterization of signal propagation delays for integrated circuits both during manufacture and during the life of the integrated circuit chip.

5 Claims, 6 Drawing Figures

CONDUCTOR PATH 10 FROM INPUT DIFFUSION 26 TO METAL CONDUCTOR 34

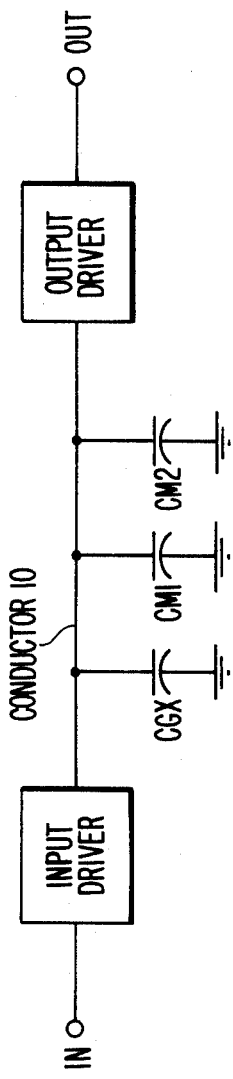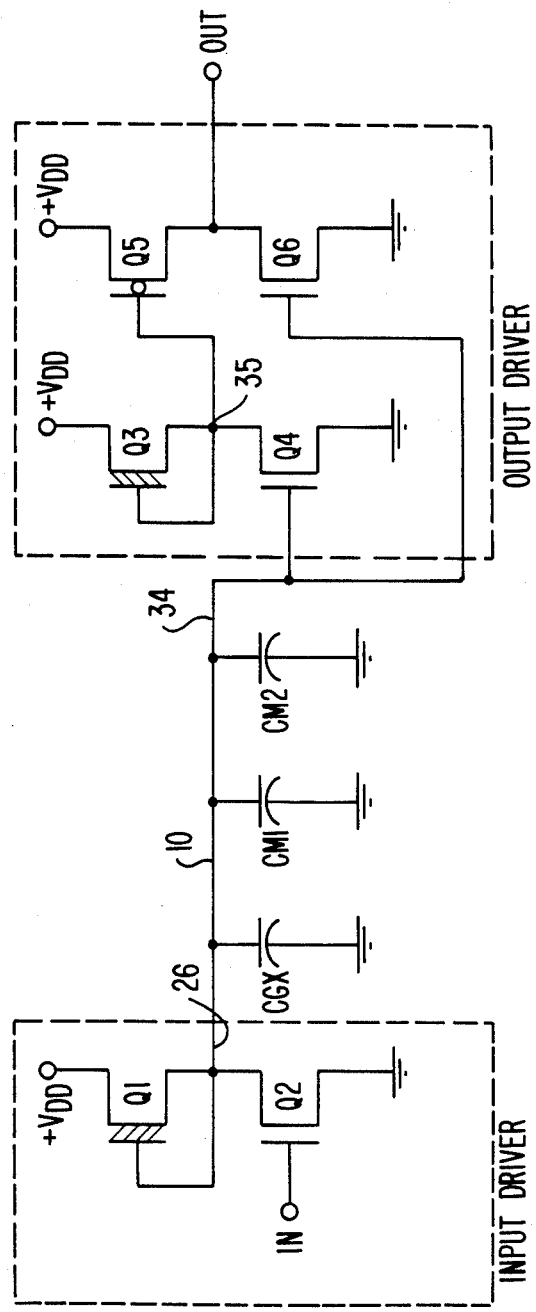
FIG. 1.
TYPICAL SIGNAL PATH
FIG. 2.
DETAILED VIEW OF TYPICAL SIGNAL PATH

CONDUCTOR PATH 10 FROM INPUT DIFFUSION 26 TO METAL CONDUCTOR 34

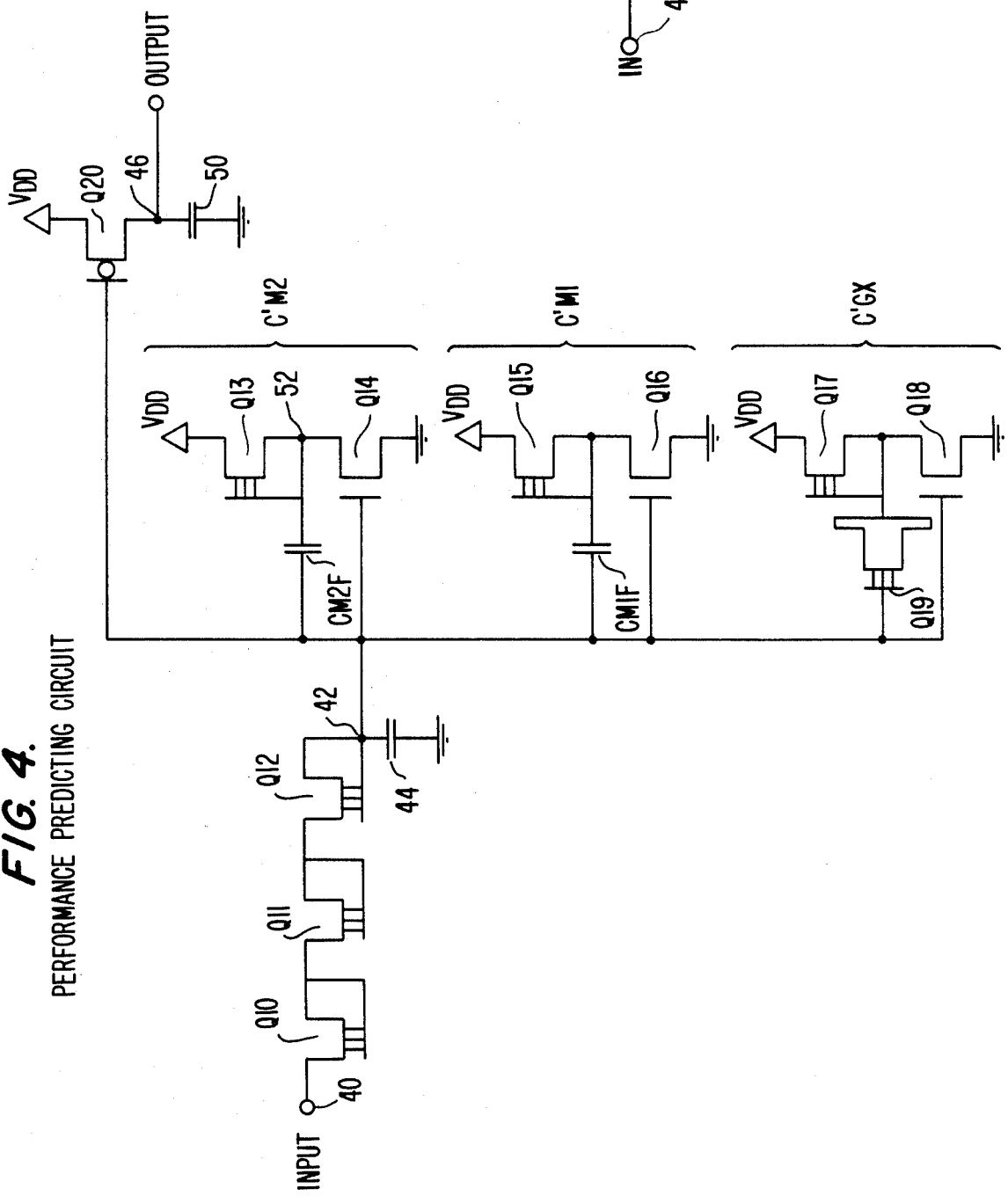
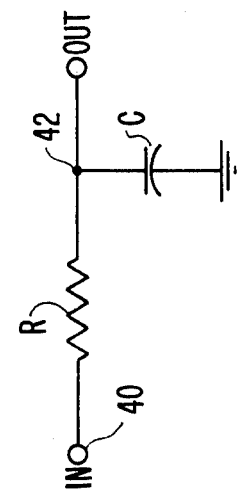
FIG. 6.
FIRST ORDER LOW PASS FILTER
FIG. 4.
PERFORMANCE PREDICTING CIRCUIT

LAYOUT OF PERFORMANCE PREDICTING CIRCUIT

ON CHIP PERFORMANCE PREDICTOR CIRCUIT

BACKGROUND OF THE INVENTION

1. Technical Field

The invention disclosed broadly relates to integrated circuit technology and more particularly relates to on chip monitoring of circuit characteristics for integrated circuit devices.

2. Background Art

FIG. 1 is a high level circuit schematic diagram of a typical signal path on an integrated circuit chip where an input signal is applied to an input driver, that signal being propagated along a low impedance conductor 10 to an output driver. The low impedance conductor 10 will have a variety of capacitive contributions CGX, which is the capacitance between field effect transistor (FET) gates and the chip substrate, CM1 which is the capacitance with respect to ground of first level aluminum conductor lines, and CM2 which is the capacitance with respect to ground of second level metal conductor lines. The signal propagation delay along the conductor 10 is a function of the magnitudes of CGX, CM1 and CM2, and the characteristics and the output impedance of the input driver and the delay characteristics of the output driver. FIG. 2 is a more detailed view of the typical signal path as was depicted in FIG. 1. The input driver is shown as a typical N channel depletion mode FET inverter circuit with the FET transistor Q1 being a depletion mode load device and the FET transistor Q2 being an enhancement mode active device, with the input terminal IN being connected to the gate of Q2 and the output terminal 26 being connected to the conductor 10. The effective resistance of Q1 is the output impedance of the input driver. The greater the magnitude of the output impedance of the input driver, the longer it will take for the drain voltage Vdd to provide a current flowing into the conductor 10 during rise time of the signal propagated on the conductor 10. The output driver shown in FIG. 2 comprises the push/pull connected pair of inverters consisting of a first inverter having the depletion mode load FET device Q3 and the enhancement mode active device Q4 and the second inverter consisting of the zero threshold FET device Q5 and the enhancement mode active device Q6. The conductor 10 applies the signal through the node 34 to the gate of the transistor Q4. The impedance of the depletion mode FET load device Q3 determines the speed with which the signal is propagated to the second inverter in the output driver. The signal is applied from the output node 35 to the gate of the natural threshold FET device Q5 and the node 34 applies the signal directly to the gate of the active enhancement mode FET device Q6. As a result, a positive going signal on the node 34 will result in a negative going signal at the output terminal OUT. The overall propagation delay from the input node IN to the input driver, over the conductor 10 to the output node OUT of the output driver is the signal propagation delay of a typical circuit on the integrated circuit chip.

Signal propagation delays can vary as a function of the process parameters which occurred during the fabrication of the integrated circuit chip. For example variations in the conductivity of the semiconductor substrate, the dopant concentration of the N-type diffusions in the substrate, variations in the thickness of the gate oxide layers and misregistrations in the photolithographic masks can result in changes in the resistance of the depletion mode FET load devices such as Q1 in the input driver. If the resistance in Q1 increases, then the signal propagation delay will be longer. If the magnitude of the resistance of Q1 decreases, then the signal propagation delay will be faster. Other variations in process parameters such as thick oxide insulator thickness, polyimide insulator thickness, metallized line widths, can influence the capacitance CM1 and CM2 for the conductor 10. If capacitance increases, then the signal propagation delay will increase. If capacitance decreases, then the signal propagation delay will decrease. Still further, if there are variations in the ion implantation concentration of dopants for the natural threshold FET device Q5, this will influence the signal propagation delay. If the threshold voltage for the FET device Q5 increases, this will increase the effective signal propagation delay, and vice versa.

Modern integrated circuits are designed with precise signal propagation delay characteristics. Oftentimes, circuits operating in parallel must have very closely matched propagation delay characteristics in order to operate properly. It is therefore important to be able to match integrated circuit chips by means of their propagation characteristics in order to have them operate as intended in such potential race conditions. It is also important to know the signal propagation delay characteristics for a circuit in order to know whether it will work in a particular application. By having an effective signal propagation delay monitor, integrated circuit chips can be sorted by their speed characteristic.

Reference will be briefly made to FIG. 3 which is a cross-sectional view of the physical structure for the conductor 10 which is a typical interconnection of circuit elements in an integrated circuit. In FIG. 3, the input node 26 for the conductor 10 can be an N-type diffusion in the P-type silicon substrate 20 which is connected through the oxide layer 28 by means of a via hole connection to the first level aluminum conductor line 30, which is referred to as the M1 layer. The conductor line 30 can have a connection through a via hole to the polycrystalline silicon conductor 24 which is part of a gate electrode for an N channel FET device 22 in the chip. The capacitance between the polycrystalline silicon gate 24 and the substrate 20 is referred to as CGX in the schematic diagram of FIG. 2. The capacitance between the first level metal conductor line 30 and the substrate 20 is referred to as CM1 in the schematic diagram of FIG. 2. Oftentimes, the integrated circuit will have two levels of metal conductor lines, the first M1 level lines running in a first direction and a second higher level M2 lines running in an orthogonal direction. As shown in the cross-sectional view of FIG. 3, a polyimide and silicon nitride layer 32 separates the lower M1 metal layer from an upper M2 metal layer and they are electrically interconnected through via hole connections. The M2 layer shown in FIG. 3 includes a conduction line 34 which forms a part of the conductor 10. The M2 layer 34 has a capacitance with respect to the substrate 20 which is referred to as CM2 in the schematic diagram of FIG. 2.

OBJECT OF THE INVENTION

It is therefore an object of the invention to provide an improved technique for predicting the performance of integrated circuits on an integrated circuit chip.

It is another object of the invention to provide an improved technique for monitoring the propagation delay of signals on an integrated circuit chip which are a function of the process parameters which occurred during the fabrication of that chip.

It is yet a further object of the invention to provide an improved performance predictor circuit which will enable the rapid characterization of signal propagation delays on integrated circuit chips during manufacture and also during the life of the chip.

It is yet a further object of the invention to provide a performance predictor circuit for monitoring signal propagation delays on integrated circuit chips, enabling the use of moderately low input driver frequencies.

SUMMARY OF THE INVENTION

These and other objects, features and advantages of the invention are accomplished by the performance predictor circuit disclosed herein. An on chip monitoring circuit is disclosed which enables the rapid characterization of signal propagation speed for integrated circuits on the same chip. The circuit is based upon a correlation between signal propagation speed on the chip and the low pass filtering characteristics of the monitoring circuit, which is a classical first order low pass filter. The monitoring circuit performs the low pass filter operation from which the operator can determine what the signal propagation characteristics are for other integrated circuits on the chip resulting from specific process parameters which occurred during the fabrication of the chip. A feature of the invention is its ability to characterize very small capacitive and resistive contributions to signal propagation delay by using input driving frequencies which are moderately low, by using the principle of the Miller Theorem. The monitoring circuit enables the rapid and accurate characterization of signal propagation delays for integrated circuits both during manufacture and during the life of the integrated circuit chip.

BRIEF DESCRIPTION OF THE DRAWINGS

These and other objects, features and advantages of the invention will be more fully appreciated with reference to the accompanying figures.

FIG. 1 is a high level circuit schematic diagram of a typical signal path on an integrated circuit chip.

FIG. 2 is a more detailed circuit schematic diagram of the typical signal path shown in FIG. 1.

FIG. 4 is a circuit schematic diagram of the performance predicting circuit, in accordance with the invention.

FIG. 6 is the first order low pass filter.

DESCRIPTION OF THE BEST MODE FOR CARRYING OUT THE INVENTION

Figure 3:
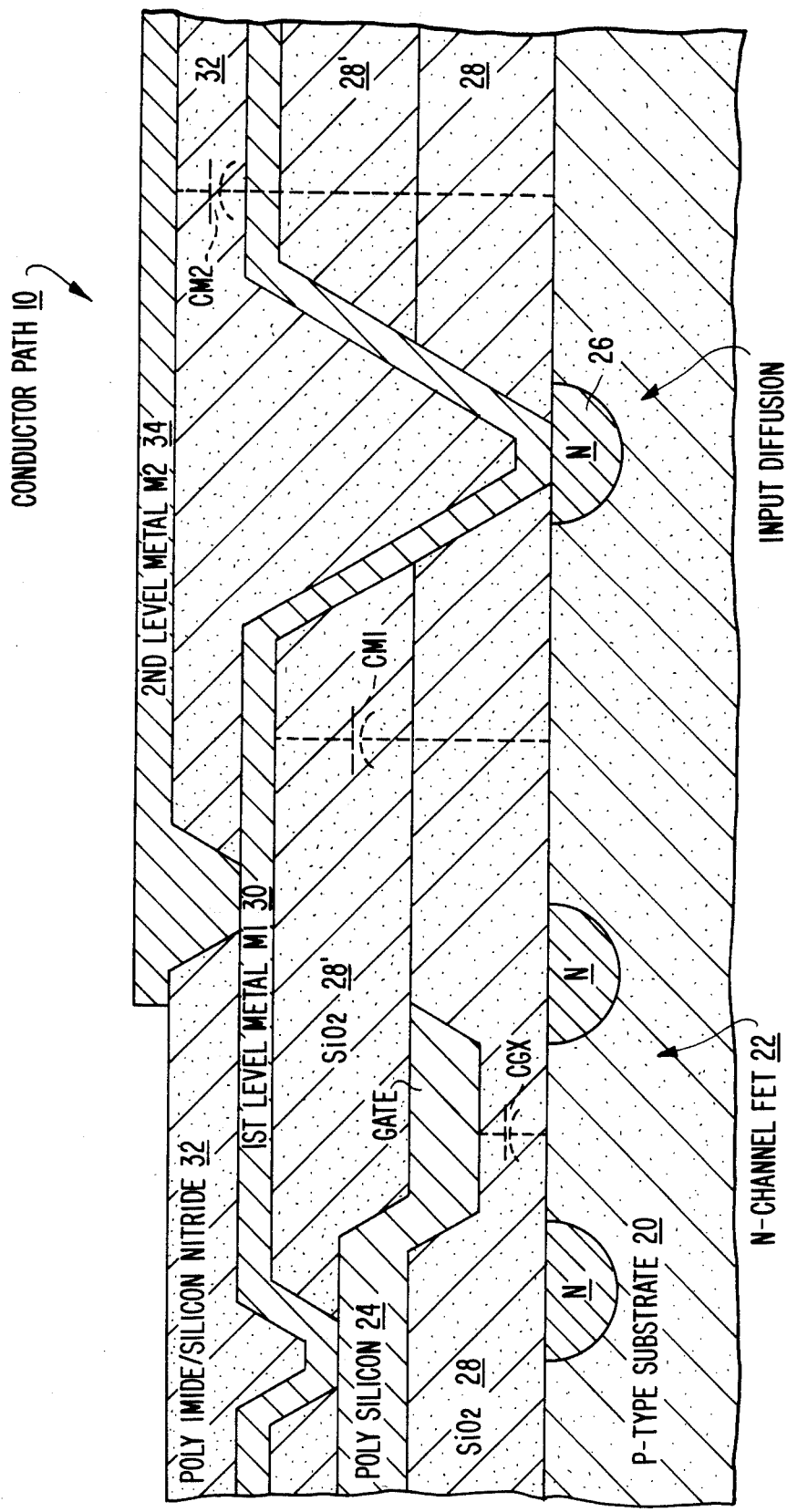
FIG. 3 is a cross-sectional view of the conductor 10 depicted in tne schematic diagram of FIG. 2.
Figure 5:
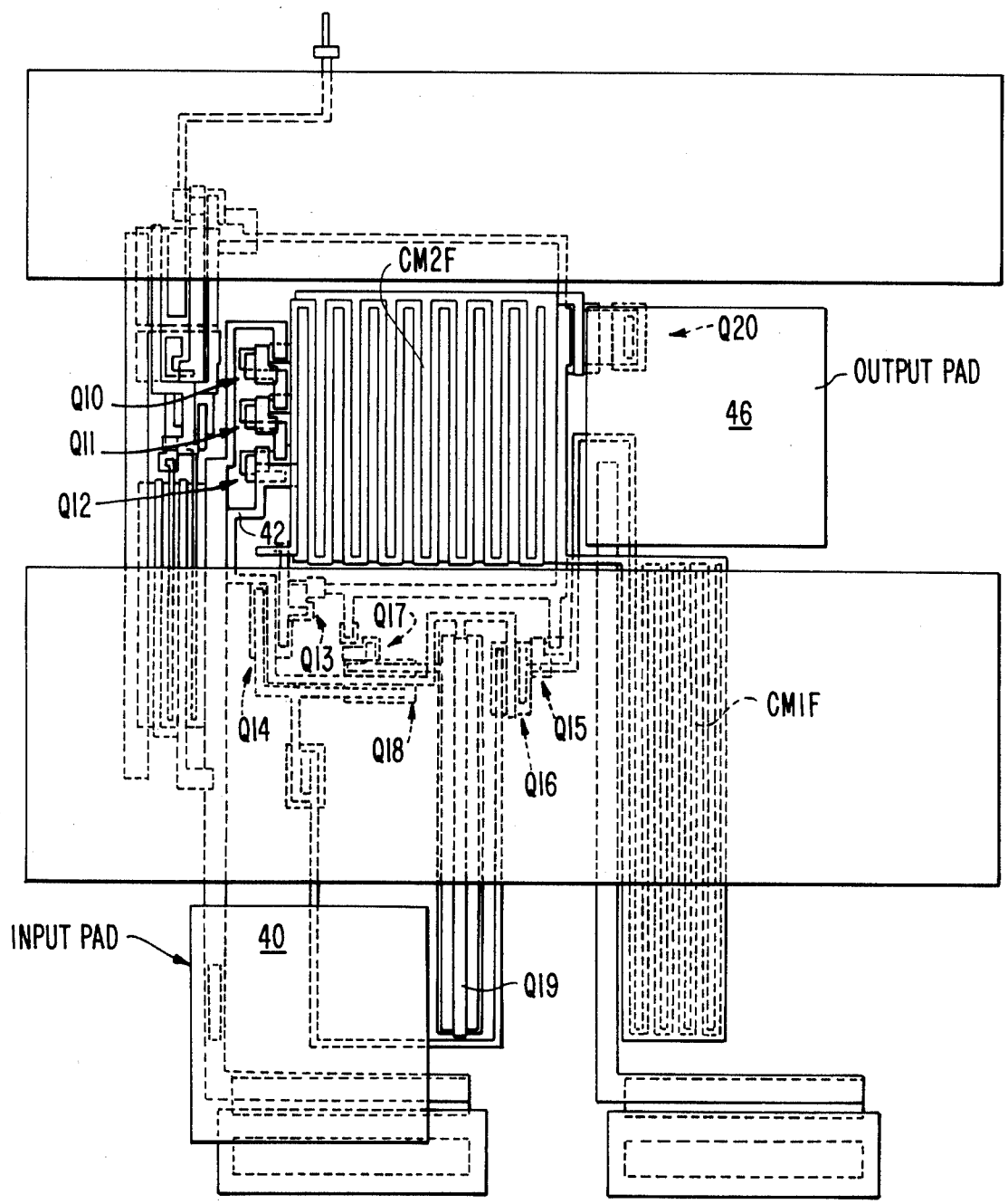
FIG. 5 is a physical layout diagram of the performance predicting circuit shown in FIG. 4.

The performance predicting circuit invention is shown in a circuit schematic diagram in FIG. 4 and its physical layout is shown, in the diagram of FIG. 5. The performance predicting circuit is embodied on the same integrated circuit chip as are the integrated circuits whose signal propagation characteristics are to be measured. Not only can the circuit be used during fabrication and at acceptance testing at the end of fabrication of the integrated circuit chip, but the performance predicting circuit of FIG. 4 can also be effective as an end-of-life monitoring circuit to periodically use during the useful life of the integrated circuit chip. The performance predicting circuit of FIG. 4 has an input node 40 to which is applied a tester driver frequency which is characteristically approximately a 3 MHz square wave. A series connected array of three FET load devices, Q10, Q11 and Q12 are connected between the input node 40 and the node 42 shown in FIG. 4. Each FET load device Q10, Q11 and Q12 has the same dimensions as the FET load devices Q1 and Q3, for example, in the circuits to be characterized on the integrated circuit chip. In that manner, variations in the degree of etching of the polycrystalline silicon gate 24 in FIG. 3 and variations in the diffusion temperature for the source and drain of the FET load devices will equally affect the characteristic impedance of the FET load devices Q10, Q11, Q12 and the circuit devices Q1 and Q3. Variations in the gate oxide thickness which occur during the manufacture of a given integrated circuit chip will also influence the effective transconductance of the FET load devices and will be reflected in the behavior of the devices Q10, Q11 and Q12 of the performance predicting circuit of FIG. 4.

Also connected to node 42 is the capacitor 44 which represents an effective capacitance between node 42 and the substrate.

Connected to the node 42 of the circuit in FIG. 4 are three capacitive equivalent circuits C'M2, C'M1 and C'GX. Each of these three capacitive equivalent circuits performs the characterization of the contribution to capacitance of the corresponding second level metal capacitance CM2, first level metal capacitance CM1, and thin oxide capacitance CGX, respectively, as previously described. The principle of operation of each of the capacitive equivalent circuits is based on the Miller Theorem which employs a feedback capacitance in an inverter circuit to provide an effective capacitance which is substantially larger than the actual physical capacitance of the feedback capacitor, thereby reducing the frequency of operation of that circuit. It is a feature of the invention that the frequency of operation of the capacitive equivalent circuits is adjusted to be within the range of practical square wave generator frequencies which would be applied to the input node 40. The Miller Theorem is discussed, for example, in Millman and Halkais, *Integrated Electronics: Analog and Digital Circuits and Systems*, McGraw-Hill, 1972.

The capacitive equivalent circuit C'M2 consists of a depletion mode FET device Q13 which has the same characteristics as the devices Q10, Q11 and Q12. C'M2 also includes the enhancement mode active device Q14 which is connected through the feedback capacitor CM2F. The capacitor CM2F has a structure shown in FIG. 5 which characterizes the capacitance CM2 of second level metal conduction lines. The structure of the capacitor CM2F in FIG. 5 is a serpentine arrangement of a nominal width conductor line on the M2 level with a dielectric whose thickness is the same as the dielectric thickness for M2 level conduction lines so that the effective capacitance between the M2 level serpentine structure and the substrate 20 characterizes the capacitance for unit length of second level metal conductors for integrated circuits on the same integrated circuit chip.

The capacitive equivalent circuit C'M1 also includes a depletion mode load device Q15 which is the same as the device Q10 and an enhancement mode active device Q16 which is connected to the feedback capacitor CM1F. The capacitor CM1F which is depicted in the layout of FIG. 5, is made up of a serpentine array of M1 conductor line whose capacitance with respect to the substrate 20 characterizes the capacitance for unit length of conductor lines on the M1 level, in the same manner as that described for CM2F.

The capacitive equivalent circuit C'GX also includes a depletion mode FET load device Q17 which is the same as the device Q10. It includes an enhancement mode active device Q18 which is connected through an MOS capacitor Q19. The MOS capacitor Q19, shown in the layout diagram of FIG. 5, provides a thin oxide capacitance whose magnitude characterizes the thin oxide capacitance CGX for the polycrystalline silicon gate capacitance with respect to the semiconductor substrate, as in a manner similar to that described for CM2F.

Node 42 is also connected to the gate of the zero threshold FET device Q20 whose output node 46 is connected through a capacitance to the substrate 20. Variations in the threshold voltage of the device Q20 which result from variations in process parameters during the manufacture of the chip, will result in changes in the output at the node 46. The FET device Q20 serves as a rectifier converting the AC potential applied at its gate to a DC potential value at the output node 46.

In operation, the effect of the various magnitudes of the process parameters for a particular chip will cause the input square wave signal at the node 40 to be represented as an AC signal at the node 42 which, when applied to the gate of the device Q20, will result in a given magnitude DC voltage at the output node 46. The magnitude of the voltage at the output of the circuit in FIG. 4 will characterize the signal propagation delay for the circuits on the same integrated circuit chip.

DETAILED DESCRIPTION OF THE OPERATION OF THE INVENTION

The performance predicting circuit of FIG. 4 is essentially a classical first order low pass filter which is represented in a more simplified form in the schematic diagram of FIG. 6. The input depletion mode load devices Q10, Q11 and Q12 have a series connected resistance which is characterized as R in FIG. 6. The capacitance of the capacitive equivalent circuits C'M2, C'M1, and C'GX, connected in parallel at the node 42, are represented by the capacitor C in FIG. 6. The behavior of the low pass filter of FIG. 6 when a square wave signal is applied to the input terminal 40 can be represented by the ratio of voltage at the output node 42 VOUT divided by the voltage applied at the input node 40, VIN. That magnitude can be characterized in the following Equation 1.

$$\frac{VOUT}{VIN} = \frac{1}{1 + wRC} \quad \text{Eq. 1}$$

where w equals 2Pi times the input frequency applied at the input node 40.

Reference to FIG. 5 will illustrate the problem of using a classical first order low pass filter model to characterize the signal propagation delay on an integrated circuit chip. The node 40 is shown in FIG. 5 as an input pad which is 0.004 inches on a side and the output node 46 is shown as an output pad with the same 0.004 inches on a side. If one were to construct a simple capacitor for C'M2 having the size of the capacitor CM2F in FIG. 5, and further if one were to construct a capacitor for C'M1 having the size of the capacitor CM1F shown in FIG. 5, and further if one were to construct a capacitor for C'GX having the size of Q19 in FIG. 5, these three capacitors would have a combined capacitance on the order of approximately 5 pico Farads. It becomes progressively less practical to increase the size of capacitors on the integrated circuit chip because they then crowd out the other circuitry on the chip. The value C is approximately 5 pico Farads for the filter of FIG. 6. The series resistance for Q10, Q11 and Q12 in FIG. 4 is a value R of approximately 600 Ohms. The resultant square wave frequency for the input signal applied at input node 40 necessary to drive the filter so that its transfer function is −3 dB, is 300 MHz. A 300 MHz square wave signal is difficult to generate with an accurate maximum amplitude. Since in order to control a 300 MHz square wave so as to apply it to the input node 40, extensive precautionary measures must be made to avoid the effects of inductive coupling, capacitive loading and other test bench problems.

Therefore, in one aspect of the invention, the capacitive equivalent circuits C'M2, C'M1, and C'GX of FIG. 4 are substituted for simple capacitors and advantage is taken of the principles of the Miller Theorem to increase the effective capacitance at node 42.

An explanation of the Miller Theorem is given here in conjunction with the capacitive equivalent circuit C'M2 of FIG. 4. The inverter consisting of the depletion mode load device Q13 and the enhancement mode active device Q14 has a gain Av of approximately 100, that is if a signal of delta 0.01 volts were applied at the gate of the device Q14, a signal of approximately delta −1 volt would be output at the output node 52 for the inverter. By connecting a feedback capacitor CM2F between the output node 52 and the gate of Q14, negative feedback operation is obtained. The potential across the capacitor CM2F will be the difference between the potential at the output node 52 and the potential at the input node 42 for the inverter which, if delta 0.01 volts is applied at node 42 and delta −1 volts is output at node 52, the potential difference across the capacitor CM2F is delta 1.01 volts. Contrast this with the circumstance where the capacitor CM2F is connected directly between the node 42 and ground potential, so that if a delta 0.01 volt potential is applied at node 42, the potential difference across the capacitor CM2F will be delta 0.01 volts. Since the charge transfer necessary to change the voltage of a capacitor is related by Q equals CV, then there will be 101 times more charge which must be applied by the node 42 to the gate of Q14 in order to raise the potential difference across the capacitor to 1.01 volts, than is necessary if the capacitor CM2F were merely connected directly to ground potential. Thus, in accordance with Miller's Theorem, the effective capacitance of the capacitive equivalent circuit C'M2 of FIG. 4 is 101 times greater than is the capacitance of the capacitor CM2F, when directly connected to ground potential. Thus, by operation of Miller's Theorem, the same size capacitor CM2F can have its effective capacitance, as seen by the node 42, 101 times greater then would be the case if the capacitor were directly connected to ground potential. This principle is also in effect for the capacitive equivalent circuits C'M1 and the capacitive circuit C'GX of FIG. 4, so that the effective capacitance represented by the parallel arrangement of C'M2, C'M1, and C'GX at the node 42 is approximately 560 pico Farads. In the classical first order low pass filter shown in FIG. 6, if C equals the sum of C'M2, C'M1 and C'GX of FIG. 4 to have a magnitude of approximately 560 pico Farads, then the driving square wave frequency applied at input node 40 necessary to have the output of the filter −3 dB with respect to the input of the filter, is now 3 MHz. A 3 MHz square wave can be easily generated by conventional circuit technology and can be readily controlled to have a reliable and accurate pulse amplitude so that the ratio of the output signal to the input signal can be precisely determined for testing purposes. Furthermore, the capacitive and inductive effects of the test equipment for a 3 MHz signal becomes much less important in the testing environment.

Variations in the process parameters for the integrated circuit chip upon which the performance predicting circuit of FIG. 4 is constructed will change the ratio of the output of the voltage amplitude to the input voltage amplitude for the circuit. Referring to Equation 1, the effective resistance R of the depletion mode load devices Q10, Q11 and Q12 can vary with process parameters, as previously discussed, and if that effective resistance increases, then the ratio of the output voltage to the input voltage correspondingly decreases. This can be measured and results in a characterization of the changes in the resistance for depletion mode load devices which can be related to propagation delays, in accordance with the invention. Alternately, if changes occur in the capacitance of the second level metal M2, the first level metal M1, or the thin oxide capacitance for circuits on the integrated circuit chip because of variations in process parameters, this will also influence the capacitance for the capacitive equivalent circuits C'M2, C'M1 and/or C'GX so that if the sum of those capacitances C increases, then in accordance with Equation 1 the ratio of the VOUT to VIN will decrease. This can also be measured for the performance predicting circuit of FIG. 4. Changes in the opposite direction for the resistance of the depletion mode load devices or of the respective types of capacitances, as a function of variations and process parameters, will cause variations in the measured output voltage in the opposite direction.

As was previously discussed, the signal propagation delay characteristic for an integrated circuit chip is a function of the resistance of the depletion mode load devices on the chip and is also a function of the capacitance for the first level metal lines M1, the second level metal lines M2, and the thin oxide capacitances on the chip. By measuring the ratio of the output voltage VOUT to the input voltage VIN for the performance predicting circuit of FIG. 4, the signal propagation delay characteristics for an integrated circuit chip can be precisely determined. If a test probe were connected to the node 42 in FIG. 4, the ratio of the output square wave signal to the input square wave signal at node 40 would represent the results of a particular set of process parameters for the integrated circuit chip under test. Alternately, the inverter in the form of the device Q20 and the capacitor 50 can be included in the performance predicting circuit of FIG. 4, which will allow rectification of the output voltage at node 42, thereby enabling a DC measurement of the output for the circuit. Since conventional testing devices are readily available to make precise measurements of DC voltages within the range of from 0 to 5 volts with a precision of +0.002 volts, a very precise measurement of the ratio of the input of the output voltage to the input voltage can be made for the performance predicting circuit of FIG. 4. This will enable a precise characterization of the signal propagation delay characteristics for an integrated circuit chip.

The capacitor 50 which is connected to the output node 46 of the circuit of FIG. 4, represents the capacitance of the output pad plus the capacitance of the probe leads and any other connections necessary to connect the pad to the tester. Variations in the magnitude of the capacitance for the capacitor 50 do not materially influence the effectiveness of the test since the potential at the node 46 can only rise as high as the potential applied to the zero threshold gate for the device Q20. The charging current to charge the capacitor 50 comes from the drain voltage Vdd, however that current flow is interrupted whenever the potential at the node 46 rises as high as the potential being applied at the gate for the device Q20. Since the gate for the device Q20 represents a high impedance low capacitance node to node 42, the output node 46 can be relatively heavily loaded with test probes and other equipment and yet not influence the operation of the performance predicting circuit of FIG. 4. Thus, by the addition of the device Q20 in the circuit of FIG. 4, the output node 42 is both buffered and rectified, thereby enabling conventional DC testers to be connected to the node 46 to make precise measurements of the relative amplitude at the output voltage at node 46 with respect to the input voltage at node 40 without affecting the operation of the circuit.

Although a specific embodiment of the invention has been disclosed, it will be understood by those having skill in the art that minor changes can be made to the specific embodiment without departing from the spirit and the scope of the invention.

What is claimed is:

1. An on chip integrated monitoring circuit for characterization of signal propagation speeds on the chip, comprising:

a first depletion mode load device having its drain connected to an input node and its source connected to a common node, having an effective resistance which is a function of process parameters for the integrated circuit chip;

an inverter circuit having a second depletion mode load FET device with its drain connected to drain potential and its source connected to the drain of an enhancement mode active device whose source is connected to ground potential and whose gate is connected to said common node;

a feedback capacitor having a first terminal connected to said source of said second depletion mode load device and its second terminal connected to said common node, having a capacitance which is a function of process control parameters for the integrated circuit chip;

said inverter having an effective gain so that the combination of said inverter and said feedback capacitor represents a capacitance at said common node having a magnitude which is approximately said gain times the capacitance of said feedback capacitor;

an output node coupled to said common node for applying a test probe thereto for measurement of the ratio of a time varying output voltage at said common node with respect to a time varying input voltage at said input node, said ratio characterizing the magnitude of the process parameters for said integrated circuit chip.

2. The circuit of claim 1 wherein said first depletion mode load device consists of a plurality of FET depletion mode load devices connected in series between said input node and said common node.

3. The circuit of claim 1 wherein said capacitor is formed by capacitance between a metal conduction line and semiconductor substrate for said integrated circuit chip.

4. The circuit of claim 1 wherein said capacitor is formed by the thin oxide capacitance for a FET device on said integrated circuit chip.

5. The circuit of claim 1 which further comprises:
a rectifier buffer circuit comprising a zero threshold FET device having its drain connected to drain potential, its gate connected to said common node, and its source connected to said output node, for presenting a low impedance and capacitance load on said common node and converting said time varying output voltage at said common node to a DC voltage for measurement.

* * * * *